United States Patent
Chikugawa

(10) Patent No.: US 7,035,301 B2
(45) Date of Patent: Apr. 25, 2006

(54) PACKAGING FOR SEMICONDUCTOR LASER DEVICE AND METHOD FOR PRODUCING THE SAME

(75) Inventor: Hiroshi Chikugawa, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 288 days.

(21) Appl. No.: 10/679,370

(22) Filed: Oct. 7, 2003

(65) Prior Publication Data
US 2004/0071175 A1     Apr. 15, 2004

(30) Foreign Application Priority Data
Oct. 7, 2002    (JP) .............................. 2002-293386

(51) Int. Cl.
*H01S 3/04*     (2006.01)
*H01S 3/00*     (2006.01)
*H01L 29/24*    (2006.01)
*H01L 23/10*    (2006.01)

(52) U.S. Cl. ........................ 372/36; 372/109; 257/100; 257/710

(58) Field of Classification Search ................ 372/109, 372/36; 257/710, 732, 100
See application file for complete search history.

(56) References Cited

U.S. PATENT DOCUMENTS

| 5,052,009 A | * | 9/1991 | Tsuboi et al. .................. 372/36 |
| 2004/0240499 A1 | * | 12/2004 | Tsuji ............................. 372/36 |
| 2005/0089070 A1 | * | 4/2005 | Honda .......................... 372/36 |

FOREIGN PATENT DOCUMENTS

| JP | 9-186406 | 7/1997 |
| JP | 2000-252575 | 9/2000 |

* cited by examiner

*Primary Examiner*—Minsun Harvey
*Assistant Examiner*—Marcia A. Golub
(74) *Attorney, Agent, or Firm*—Morrison & Foerster LLP

(57) ABSTRACT

In a semiconductor laser device, a flange (33) of a cap (32) is provided with straight-line cut-off portions (34) that are the same in number as notches (36, 37) of a stem (35). With the cut-off portions (34) positioned so as not to overlap the notches (36, 37) of the stem (35) in position, welding between the cap (32) and the stem (35) is performed. The cut-off portions (34) of the cap (32) secure obtainment of a reference plane 38 with a large area in a place where the notches (36, 37) of the stem (35) are absent. As a result, sufficient precision in optical characteristics can be secured while suppressing an influence of unevenness of the stem (35) having a small diameter on a deviation angle θ of an optical axis from a normal line to a reference plane of an optical pickup.

6 Claims, 6 Drawing Sheets

Fig. 4A
PRIOR ART
Fig. 4B
PRIOR ART
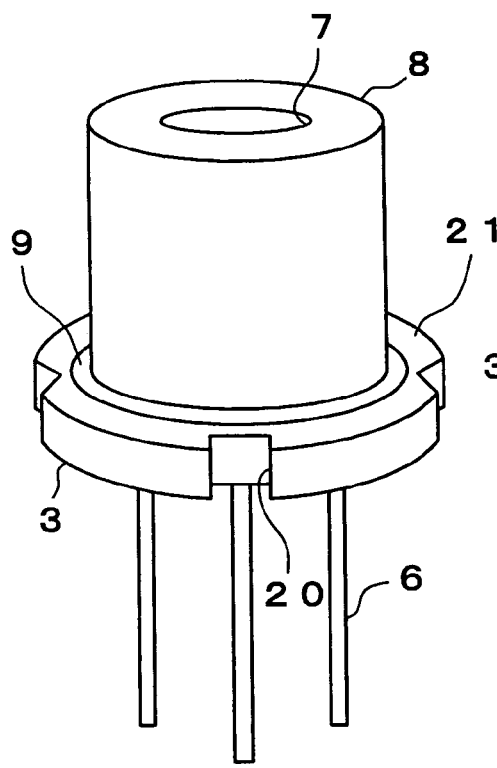
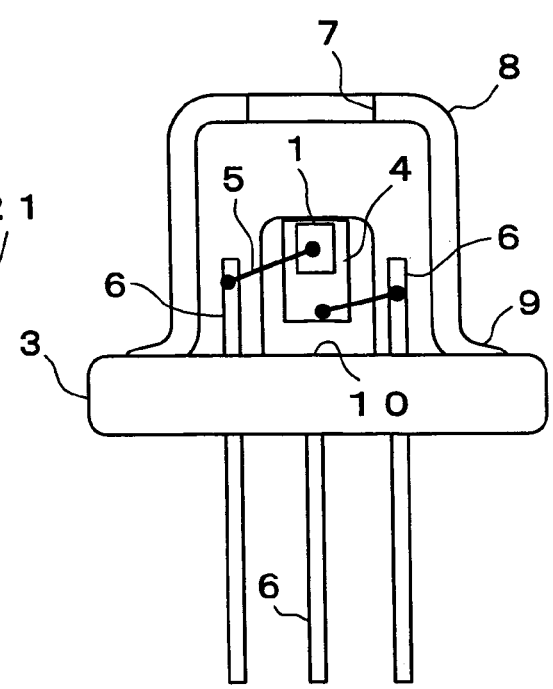

PACKAGING FOR SEMICONDUCTOR LASER DEVICE AND METHOD FOR PRODUCING THE SAME

BACKGROUND OF THE INVENTION

The present invention relates to a semiconductor laser device that is used for an optical recording information device such as CD-ROM, CD-R/RW, MO and DVD, and a method for producing the same.

As a semiconductor laser device in which a semiconductor laser element is mounted on a stem, there has hitherto been one shown in FIGS. 4A and 4B. FIG. 4A is a perspective view showing the exterior of the device, and FIG. 4B is a longitudinal cross-sectional view thereof. A semiconductor laser element 1 and a monitoring photodiode (not shown) are die bonded to a submount 4 of a stem 3 and they are connected to lead pins 6 using Au wires 5. Further, a cap 8 is welded to the stem 3 by electric welding, and for the purpose of protecting the semiconductor element from dust from outside, external stress and/or optical interference, the cap 8 is provided with a window opening 7 letting laser beams pass therethrough (e.g., see JP-2000-252575A).

Welding between the stem 3 and the cap 8 is carried out as follows. That is, a flange 9 formed by bending an edge portion of the cap 8 outwardly is placed on an upper surface 10 of the stem 3. Then, as shown in FIG. 5, while applying a pressure to an upper side of the flange 9 and a lower surface of the stem 3 using an upper electrode and a lower electrode, a large current is instantaneously passed via wiring 14. Thereby, a junction portion between the flange 9 and the stem 3 is heated to a high temperature and part of the junction portion is melted to be welded (e.g., see JP-2000-252575A). Particularly, in the case where the junction portion requires hermeticity, the cap 8 is circumferentially provided with a separate flange for welding. Further, in order to carry out welding stably, it is required that the width of the flange 9 be increased.

As shown in FIG. 6, when a circular or oval semiconductor laser device 15 is incorporated in an optical pickup, in order to reduce the height of a space underneath a disc 16 as much as possible, an optical axis 18 is bent at a right angle by using a mirror 17 or a prism, and a laser beam is focused by an objective lens 19 on the disc 16 positioned above.

The semiconductor laser device 15 is constructed in a manner so as to be able to rotate about the optical axis 18 for the purpose of adjusting variations in various characteristics including polarization characteristics due to the fact that emitted light from the semiconductor laser element is spread not in a circular shape, but in an ellipse shape having different spread angles between vertical and horizontal directions. In order to rotate or position the semiconductor laser device 15, the stem 3 is provided with V- or U-shaped notches.

If the position of a light-emitting point is changed when rotating the semiconductor laser device 15, various problems occur. Therefore, in order to prevent the light-emitting point from being changed, the stem 3 is formed in a circular shape or an ellipse shape in which part of the circular shape is left, so that the light-emitting point is positioned at the center of the circular portion.

However, the conventional semiconductor laser device has the following problem. That is, if the light-emitting point is positioned at the center of the circular portion because of the necessity of rotating the semiconductor laser device 15, a distance H between the optical axis 18 and a lower edge portion of the stem 3 is indispensably required, which is a cause of hampering a reduction in the thickness of the optical pickup.

For that reason, in order to reduce the above distance H, stems of which the outer size (diameter $\phi$) is reduced to 9 mm, 5.6 mm, 3.5 mm, and 3.3 mm are suggested every year. D- or ellipse-shaped stems formed by cutting off part of their circular portions have also been devised. However, when the semiconductor laser device is rotated for optical adjustment, the cut-off straight-line portions are not necessarily positioned at the bottom of the optical pickup. Thus, miniaturization corresponding to the cut-off portions is not secured.

In the case where the external shape of the stem 3 is circular, the miniaturization also reduces the outer diameter of the cap 8. However, errors in sizes of members, errors in sealing a cap (eccentricity degrees), sagging at edge portions of the stem 3 and so on are not reduced. Thus, a region of the upper surface 10 of the stem 3 that is exposed from the flange 9 of the cap 8 and is used as a reference plane 21 is further reduced. As shown in FIG. 7, a practically effective width, $W_{eff}$, of the reference plane 21 is much shorter than a value, $W_{cal}$, obtained by simply subtracting the radius of the cap 8 (including the flange 9) from the radius of the stem 3 (i.e., a calculated width of the reference plane). This becomes more conspicuous as the outer diameter of the stem 3 decreases.

FIG. 8 shows the relationship between the deviation angle $\theta$ of the optical axis 18 from the normal line to a reference plane 22 of the optical pickup, which angle is attributable to unevenness (flatness), d, of the reference plane 21 shown in FIG. 9, and the diameter of the stem 3. In this case also, the influence of a raised portion of the reference plane 21 on the deviation angle $\theta$ becomes larger as the diameter of the stem 3 decreases. Therefore, as the diameter of the stem 3 becomes smaller, the deviation angle $\theta$ becomes larger. In this manner, as the region serving as the reference plane 21 becomes smaller, even slight unevenness, d, would make the deviation angle $\theta$ of the optical axis 18 larger. In general, it is required that the deviation angle $\theta$ of the optical axis 18 in the semiconductor laser device 15 be in the range of from 1° to 1.5°. Previously, a big factor to the deviation angle $\theta$ was the die bonding accuracy of the semiconductor laser element 15. Recently, however, as the diameter of the stem decreases, the area of the reference plane 21 becomes a problem.

In welding between the cap 8 and the stem 3, if the flange 9 to be welded is formed uniformly in a circular shape, an applied current uniformly flows, so that welding is uniformly carried out. However, if the flange 9 is not uniform, uniform welding may not be carried out due to differences in pressure-applying conditions at welding portions and contact conditions such as surface conditions.

On the other hand, in a non-hermetic type semiconductor laser device in which the window 7 of the cap 8 is not closed by a permeable material such as glass, when incorporating it into an optical pickup, there is a case in which a hermitically semi-hermetic state occurs due to adhesion of an adhesive resin to the window, which resin is used when fitting an optical component or fixing the semiconductor laser device itself. When such a semi-hermetic state occurs, air with high humidity that has entered the cap due to fluctuations in temperature may condense, instead of going out of the cap, which results in deterioration of the semiconductor laser element, or which adversely affects the optical characteristics remarkably.

SUMMARY OF THE INVENTION

An object of this invention is to provide a semiconductor laser device which can secure a sufficient area for a reference plane in view of retaining precision in optical characteristics and which can also cope with changes in environmental humidity, and to provide a method for producing the same.

In order to achieve the above object, in a semiconductor laser device according to the present invention, a flange of a cap, which is to be welded to an upper surface of a generally circular stem mounted with a semiconductor laser element for covering the semiconductor laser element for its protection, is provided with at least one cut-off portion. When the cap is in a state welded to the stem, the cut-off portion(s) of the flange is/are positioned in a region of the stem in which no notch is present.

With the above construction, with the cut-off portion(s) positioned in the region having no notch of the stem, the cap is welded to the stem. Thus, the stem has locally a reference plane with a large area, in which neither a notch of the stem nor a flange portion is present. Therefore, even with the same degree of unevenness in the reference plane, an increase in the area of the reference plane accordingly reduces the effect on the deviation angle θ of the optical axis of the semiconductor laser element from the normal line to the reference plane of the optical pickup. As a result, deterioration of the optical characteristics due to a reduction in the area of the reference plane of the stem accompanying the miniaturization of the stem is suppressed, thus making it possible to further reduce the diameter of the circular stem.

According to the present invention, the reduction in the diameter of the stem makes it possible to form an optical pickup thinly while maintaining the conventional quality. Therefore, it is possible to produce thinner drive devices for CD-R, DVD, etc., and it is also possible to miniaturize a product in which they are built.

In one embodiment, the number of notches provided at the outer peripheral part of the stem and the number of cut-off portions of the flange are three or more.

According to this embodiment, a total area of the reference plane of the stem is increased. In particular, in the case of the diameter of the stem of as small as 3.5 mm or less, in which case the deviation angle θ of the optical axis of the semiconductor laser element is liable to remarkably increase, the effect of unevenness of the reference plane on the deviation angle θ is reduced, so that deterioration of the optical characteristics is suppressed.

In one embodiment, a difference between a radius of the circular stem and that of the flange is 0.4 mm or less.

This embodiment is effective in securing a sufficient effective area of the reference plane in the case where a calculated width of the reference plane of the stem represented by the difference between the radius of the circular stem and that of the flange is not more than 0.4 mm.

In one embodiment, a venthole is provided in a side surface of the cap at a location corresponding to the cut-off portion. The venthole may communicate with the cut-off portion.

According to the embodiment, when the flange of the cap is welded to the upper surface of the stem, the venthole prevents the cap from being semi-hermetic, thus making it possible to easily escape air with high humidity that has entered the inside of the cap to the outside easily. As a result, condensation inside the cap is prevented, so that deterioration of the semiconductor laser element or adverse influence on the optical characteristics is prevented.

In a method of the semiconductor laser device according to the present invention, when welding a flange of a cap, which is provided with at least one cut-off portion, to an upper surface of a generally circular stem having at least one notch at an outer peripheral part thereof, positioning of the stem is performed using the at least one notch of the stem, and positioning of the cap is performed using the at least one cut-off portion of the flange of the cap such that the or each cut-off portion is located in a region having no notch of the stem.

With the above construction, the cut-off portion(s) of the flange of the cap is/are correctly positioned in the region having no notch of the stem and then the cap is welded to the upper surface of the stem. In this manner, the reference plane with a large area is obtained surely.

In one embodiment, the flange has a plurality of cut-off portions, and partial flange portions into which the flange is divided by these cut-off portions are welded to the stem by independent electrodes and power supplies.

According to the embodiment, the pressure-applying conditions at welded portions between the individual partial flange portions and the stem as well as contact conditions such as surface conditions become roughly uniform. Consequently, uniform welding is achieved so that deterioration of the welded portions is prevented.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 4A and 4B are a perspective view and a longitudinal sectional view showing the structure of a conventional semiconductor laser device, respectively;

DETAILED DESCRIPTION OF THE PREFERRED EMBODIMENTS

Figure 1A:
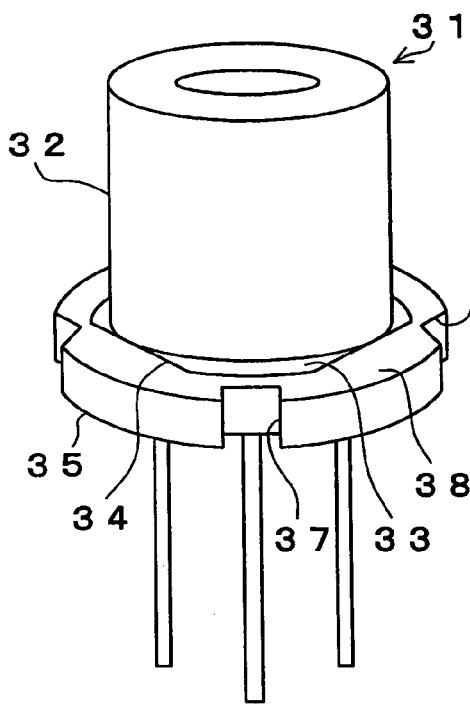
FIGS. 1A and 1B are a perspective view and a plan view of a semiconductor laser device of this invention, respectively.
Figure 1B:
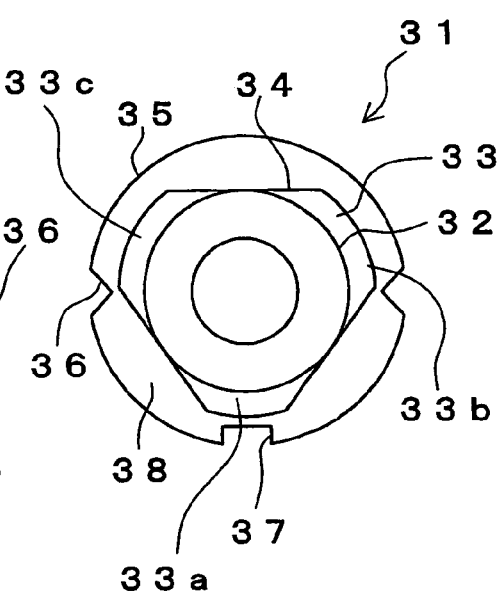

The present invention will hereinafter be described in detail by way of examples illustrated. FIG. 1A and FIG. 1B are external views of a semiconductor laser device of an embodiment of the present invention. FIG. 1A is a perspective view, and FIG. 1B is a plan view. In the semiconductor laser device 31 according to the present embodiment, a flange 33 provided circumferentially at a lower-edge portion of a cap 32 is formed into a shape having three cut-off portions 34 formed by cutting off three portions along respective straight lines from a ring or annulus shape with a constant width. The flange 33 of the cap 32 is positioned or aligned with respect to a circular stem 35 having two V-shaped notches and one U-shaped notch, totally three notches, so that the cut-off portions 34 of the flange 33 substantially do not overlap the notches 36, 37 of the stem 35 in position. Then, welding is performed.

Thus, welding is carried out in a state that the cut-off portions 34 of the flange 33 substantially do not overlap the notches 36, 37 of the stem 35 in position, whereby use of locations in the vicinity of the notches 36, 37 for a reference plane is avoided (Such locations originally have a small area of the reference plane.). This, in combination with almost no melted material coming out of the cut-off portions 34 of the flange 33 when welding, makes it possible to secure the reference plane 38 with a large area.

Figure 7:
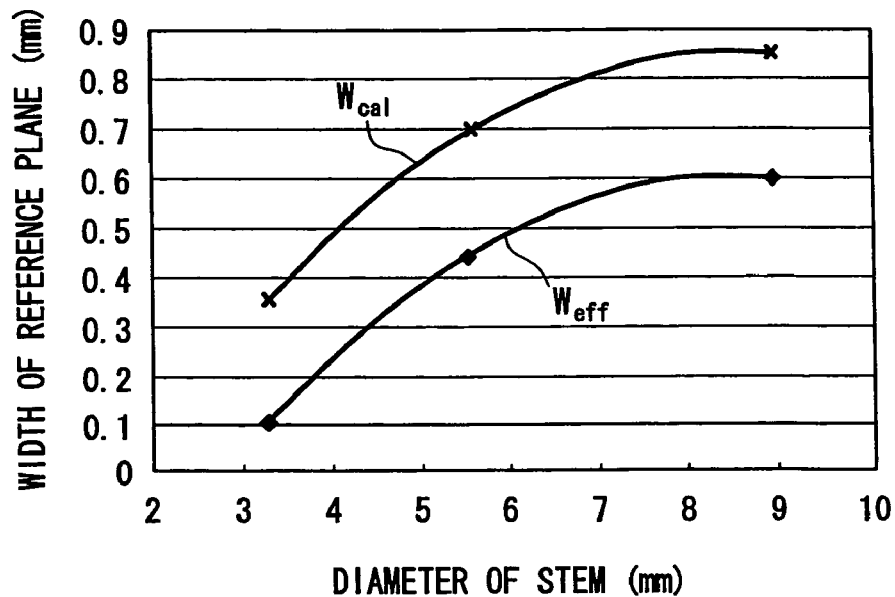
FIG. 7 is a graph showing the relationship between both the practically effective width of a reference plane and the calculated width of the reference plane, and the diameter of a stem in prior art.
Figure 8:
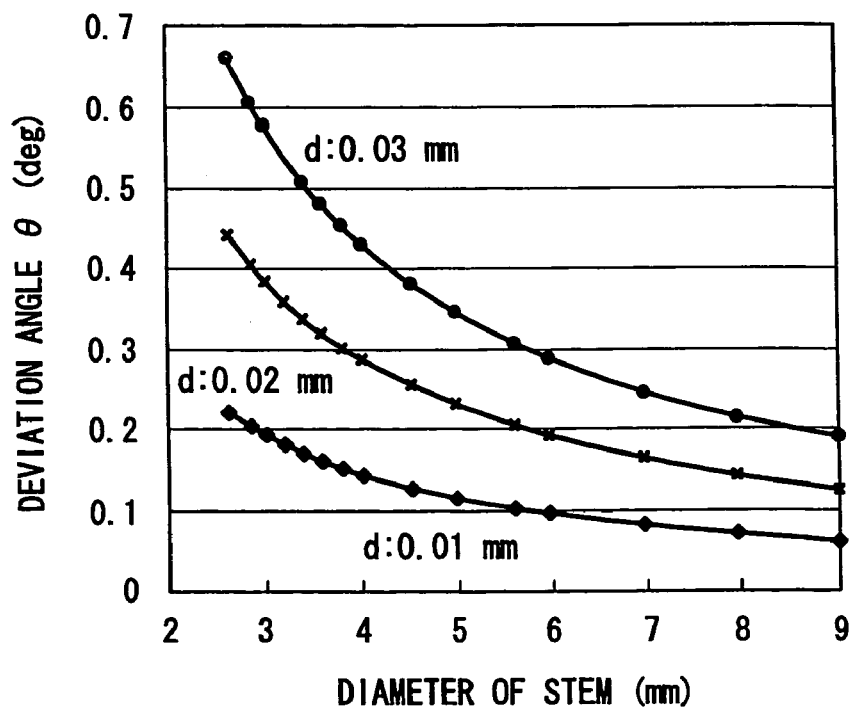
FIG. 8 is a graph showing the relationship between the deviation angle of an optical axis from a normal line to a reference plane of an optical pickup and the diameter of a stem.
Figure 9:
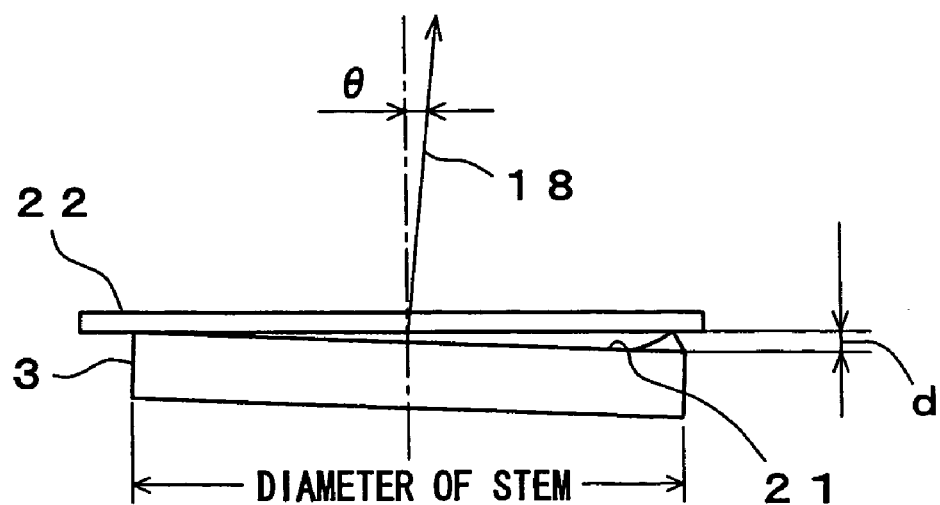
FIG. 9 is an explanatory view for the deviation angle in FIG. 8.

An increase in the area of the reference plane 38 on the stem 35 reduces the influence of a raised portion of the reference plane 38 on the deviation angle θ. Thus, the area-increased reference plane is less influenced by even a slight projection or recess of the reference plane 38. As a result, a curve shown in FIG. 8 representing the relationship between the diameter of the stem 3 and the deviation angle θ of the optical axis 18 in the conventional reference plane 21 is shifted downward (to the side of decreasing the deviation angle θ), so that the deviation angle θ decreases in the stem even with the same diameter as the conventional one. Since the deviation angle θ remarkably increases at the diameter of the stem of about 3.5 mm, as shown in FIG. 7, the increasing of the area of the reference plane is effective, particularly in the case where the calculated width of the reference plane that is a difference between the radius of the stem and that of the cap (including the flange) is not more than 0.4 mm.

Incidentally, the hermeticity or airtightness of the cap 32 becomes insufficient because the flange 33 of the cap 32 is partly cut off. However, there is a non-hermetic type semiconductor laser device having no window glass at a window portion of the cap. Thus, applying the present invention to such a non-sealed type semiconductor laser device can achieve a great effect, regardless of the problem related to the sealing properties.

Figure 2A:
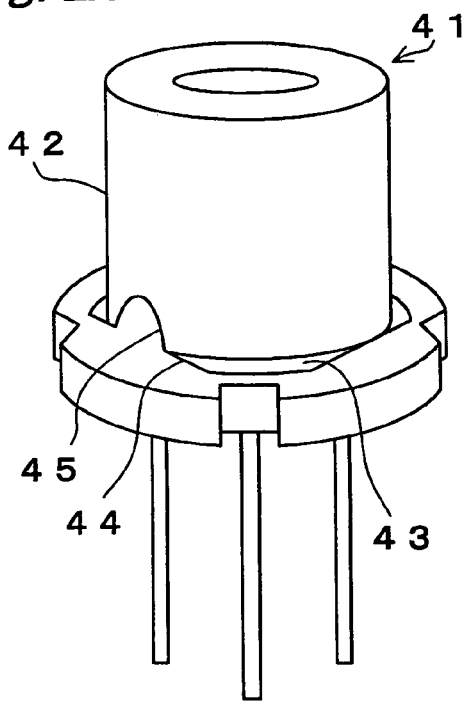
FIGS. 2A and 2B are a perspective view and a plan view of a semiconductor laser device different from the one shown in FIGS. 1A and 1B, respectively.

However, in the case of the non-hermetic type semiconductor laser device, a semi-hermetic state is sometimes created depending on the method of incorporating it into an optical pickup. Therefore, in a semiconductor laser device 41 shown in FIGS. 2A and 2B, in order to prevent such a semi-hermetic state, a cap is provided with a venthole 45. FIG. 2A is a perspective view and FIG. 2B is a plan view.

Figure 2B:
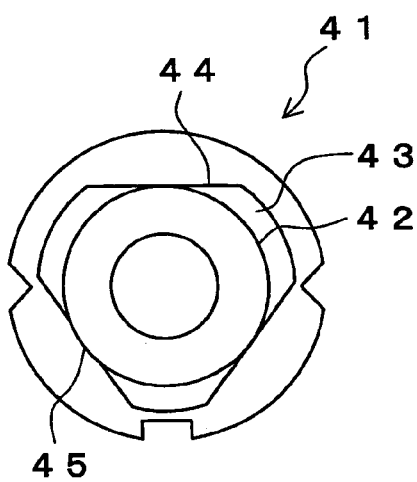

In the semiconductor laser device 41 shown in FIGS. 2A and 2B, when cutting off three portions of a flange 43 of the cap 42 to form cut-off portions 44, at least one of the portions is cut off together with a lower end portion of a body of the cap 42. Thereby, the venthole 45 is provided. This secures sufficient ventilation or air permeability through this hole 45 and prevents an increase in the humidity inside the cap 42 in a semi-hermetic state.

As described above, in the embodiment shown in FIGS. 1A and 1B, the flange 33 of the cap 32 is provided with the straight-line cut-off portions 34 of the same number as that of the notches 36, 37 of the stem 35. Then, the flange 33 of the cap 32 is welded to the stem 35 after carrying out positioning so that there is substantially no overlapping in position between the cut-off portions 34 and the notches 36, 37 of the stem 35. In this manner, a large-area reference plane 38 is provided in regions of the stem 35 in which the notches 36, 37 are absent, by the cut-off portions 34 of the cap 32.

As a result, the influence of the unevenness (flatness) of the stem 35 on the deviation angle θ is suppressed even in the case where the diameter of the stem 35 is small, so that sufficient precision in the optical characteristics can be secured.

By the way, in the welding process, if the upper side of partial flange portions 33a, 33b, and 33c obtained by dividing the flange 33 by the cut-off portions 34 and the lower surface of the stem 35 are sandwiched by only one pair of an upper electrode and a lower electrode as in the conventional manner, and, while applying a pressure using the electrodes, a large current is passed instantaneously therethrough, then the current does not uniformly flow through each of the partial flange portions 33a, 33b, and 33c due to a difference in surface resistance attributable to a difference in the processing precision of the flange 33 or a difference in the surface condition between the flange 33 and the stem 35. If this arises, welding conditions in each of the partial flange portions 33a, 33b, and 33c are different. In worst cases, a failure in welding would occur, or the reference plane 38 would have a smaller area than expected, because of an increased amount of melting of a partial flange portion.

Figure 3B:
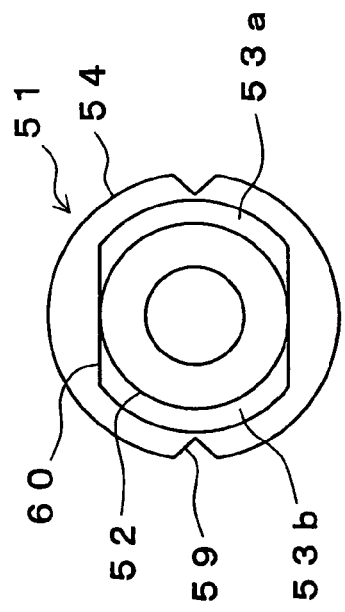
FIGS. 3B and 3C are a perspective view and a plan view of a semiconductor laser device having a cap and a stem welded to each other by the method shown in FIG. 3A, respectively.
Figure 3C:
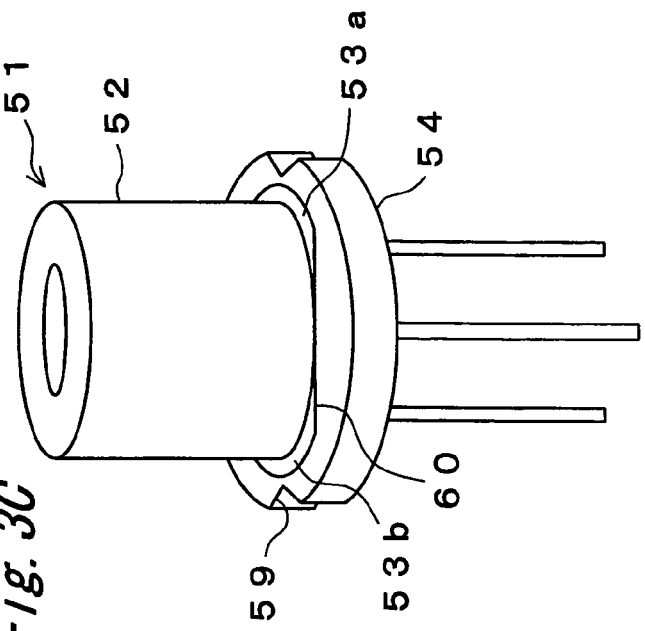
Figure 3A:
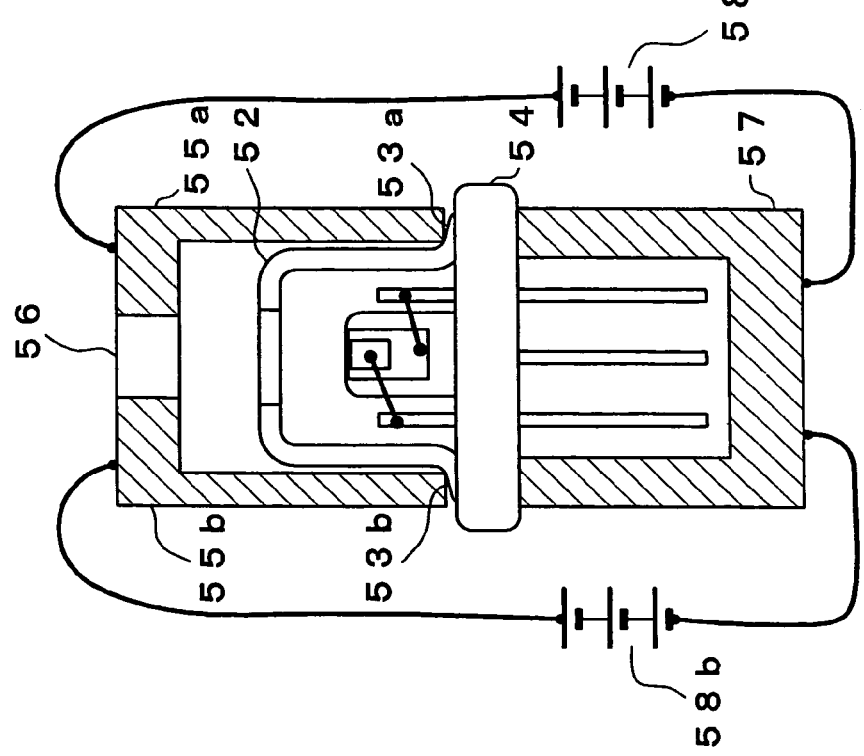
FIG. 3A is a view for explaining a method for welding a cap having divided flange portions to a stem.
Figure 5:
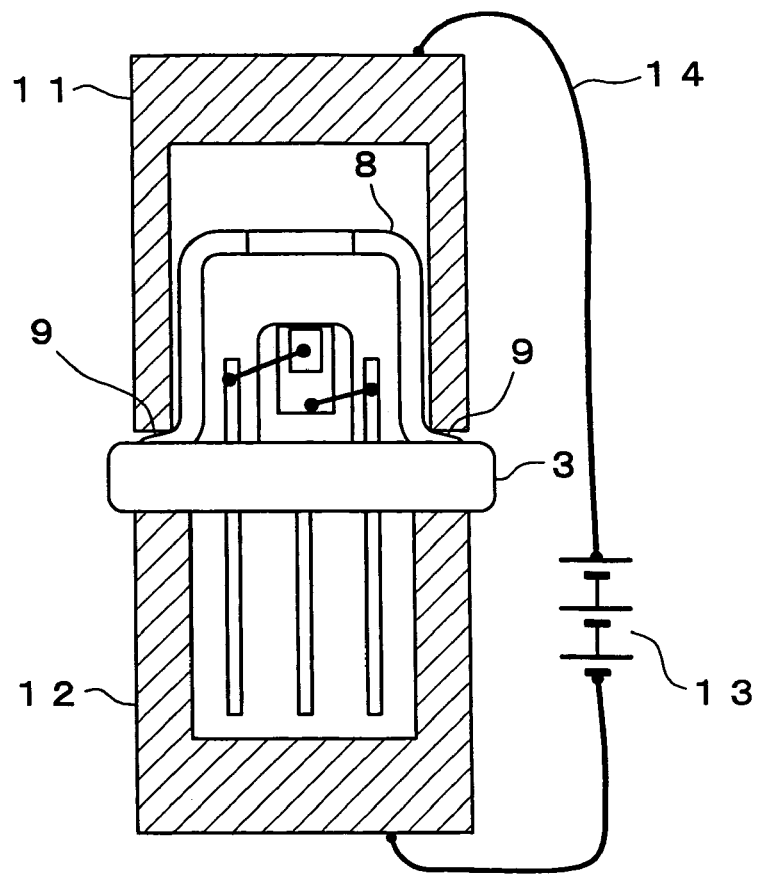
FIG. 5 is an explanatory view for illustrating a method for welding the cap to the stem shown in FIG. 4A and FIG. 4B.
Figure 6:
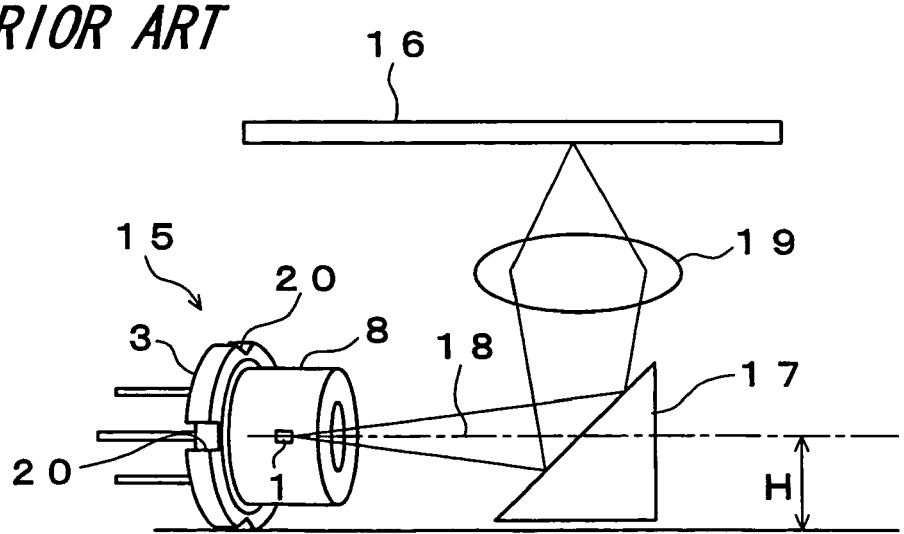
FIG. 6 is a view showing a state in which a semiconductor laser device is incorporated into an optical pickup.

To avoid this, in the present embodiment, as shown in FIG. 3A, each partial flange portion is welded using independent upper electrodes. FIG. 3A shows a state in which a flange 53 of a cap 52 is welded to a stem 54, FIG. 3B is a plan view of a semiconductor laser device 51, and FIG. 3C is a perspective view of the semiconductor laser device 51.

In the case of FIG. 3A through FIG. 3C, the flange 53 of the cap 52 is divided into two partial flange portions 53a and 53b, and an upper electrode is also divided into two portions electrically separated by an insulator 56, i.e., a first upper electrode 55a and a second upper electrode 55b. The number of the upper electrodes corresponds to the number of divided portions of the flange 53. On the other hand, a lower electrode 57 is not divided. Then, the partial flange portion 53a and the stem 54 are pressurized and welded together using the first upper electrode 55a, the lower electrode 57 and a first power supply 58a. Independently of that, the partial flange portion 53b and the stem 54 are pressurized and welded together using the second upper electrode 55b, the lower electrode 57 and a second power supply 58b. Thereby, each of the partial flange portions 53a and 53b is surely welded, thus making it possible to prevent welding failure.

When the cap 52 in which the flange 53 is divided is welded to the stem 54, it is necessary to align the notches 59 of the stem 54, the cut-off portions 60 of the cap 52, and the first and second upper electrodes 55a and 55b with one another. Thus, it is required that the stem 54 and the cap 52 be set to the lower electrode 57 in an aligned manner first. In this case, the stem 54 is aligned using the notches 59. Then, the cap 52 is aligned with the stem 54, using the straight line-shaped cut-off portions 60. It is a matter of course that the first and second upper electrodes 55a, 55b are set beforehand so as to be aligned with the cap 52 and therefore the partial flange portions 53a, 53b are to be brought into contact with the corresponding first and second upper electrodes 55a, 55b, respectively. Thereby, the partial flange portions 53a, 53b are individually welded.

In the above embodiment, the number of notches 36, 37, 59 provided in the peripheral parts of the stems 35, 54, and the number of cut-off portions 34, 60 provided at the flanges 35, 53 are two or more. However, in the case where the diameters of the stems 35, 54 are smaller than those of conventional ones (particularly, in the case of not more than 35 mmφ), it is effective to set the above numbers to at least three in order to obtain a reference plane with a larger area. Even with the numbers being one, the effect of increasing the reference plane is obtained to some extent.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device, comprising:
   a semiconductor laser element;
   a generally circular stem to which said semiconductor laser element is mounted, said stem having at least one notch at an outer peripheral part thereof; and
   a cap covering said semiconductor laser element, said cap having a flange for welding to an upper surface of the stem, wherein
      said flange of the cap is provided with at least one cut-off portion; and
      when said cap is in a state welded to the stem, at least one said cut-off portion of the flange is positioned in a region of the stem in which no notch is present.

2. The semiconductor laser device according to claim 1, wherein the number of notches provided at the outer peripheral part of the stem and the number of cut-off portions of the flange are three or more.

3. The semiconductor laser device according to claim 1, wherein a difference between a radius of the circular stem and that of the flange is 0.4 mm or less.

4. The semiconductor laser device according to claim 1, wherein a venthole is provided in a side surface of the cap at a location corresponding to said cut-off portion.

5. A method for producing the semiconductor laser device of claim 1, comprising welding a flange of a cap, which is provided with said at least one cut-off portion, to an upper surface of a generally circular stem having at least one notch at an outer peripheral part thereof and, when welding the flange:
   positioning the stem using said at least one notch of the stem; and
   positioning the cap using said at least one cutoff portion of the flange of the cap such that at least one said cut-off portion is located in a region having no notch of the stem.

6. The method according to claim 5, wherein said flange has a plurality of cut-off portions, and partial flange portions into which the flange is divided by these cut-off portions are welded to the stem by independent electrodes and power supplies.

* * * * *